(12) United States Patent
Estevez-Garcia

(10) Patent No.: US 7,095,055 B2
(45) Date of Patent: Aug. 22, 2006

(54) OPTICAL TRANSMITTER MODULE

(75) Inventor: Jaime Estevez-Garcia, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/946,739

(22) Filed: Sep. 4, 2001

(65) Prior Publication Data

US 2002/0061036 A1    May 23, 2002

(30) Foreign Application Priority Data

Sep. 4, 2000    (DE) .................................. 100 43 483

(51) Int. Cl.
*H01L 27/15* (2006.01)
(52) U.S. Cl. ..................... 257/83; 257/81; 257/84; 257/99; 257/100
(58) Field of Classification Search ............... 257/777, 257/724, 723, 433, 432, 82, 81
See application file for complete search history.

(56) References Cited

U.S. PATENT DOCUMENTS

| 4,152,624 A | * | 5/1979 | Knaebel ..................... 313/499 |
| 4,410,469 A | | 10/1983 | Katagiri et al. |
| 4,878,107 A | * | 10/1989 | Hopper ........................ 357/72 |
| 5,237,434 A | | 8/1993 | Feldman et al. |
| 5,616,140 A | * | 4/1997 | Prescott ...................... 606/10 |
| 6,206,582 B1 | * | 3/2001 | Gilliland ..................... 385/92 |
| 6,228,911 B1 | * | 5/2001 | Gilg ............................. 524/91 |
| 6,438,149 B1 | * | 8/2002 | Tayebati et al. ............. 372/45 |
| 2001/0035492 A1 | | 11/2001 | Estevez-Garcia |
| 2003/0007749 A1 | | 1/2003 | Hurt et al. |

FOREIGN PATENT DOCUMENTS

| DE | 198 45 703 A1 | 4/2000 |
| DE | 100 04 411 A1 | 8/2001 |
| EP | 0 994 509 A2 | 4/2000 |
| JP | 05-110128 | * 4/1993 |
| WO | WO 95/28744 | 10/1995 |

* cited by examiner

*Primary Examiner*—Wai-Sing Louie
(74) *Attorney, Agent, or Firm*—Laurence A. Greenberg; Werner H. Stemer; Ralph E. Locher

(57) ABSTRACT

The invention relates to an optical transmitting module which has at least one first semiconductor chip which in each case has at least one vertical light-emitting semiconductor component which is designed for transmitting data and/or signals, and which has at least one second semiconductor chip which has a semiconductor switching device which is provided for the purpose of switching the vertical light-emitting semiconductor component, the first semiconductor chip(s) and the second semiconductor chip(s) being embedded jointly in a single housing.

13 Claims, 2 Drawing Sheets

OPTICAL TRANSMITTER MODULE

BACKGROUND OF THE INVENTION

Field of the Invention:

The invention relates to a semiconductor-based optical transmitting module.

Semiconductor-based optical transmitting modules such as infrared diodes, for example, are used in numerous technical application fields for transmitting signals and data, for example as door openers in motor vehicles, in remote controls for TV, video and hi-fi equipment, for data transmission from program-controlled units to peripheral equipment and the like.

Currently, it is the widespread IRDA Standard that is predominantly used for optical data transmission by means of diodes. An advantage of this standard consists in that in the case of battery-operated equipment it is possible to achieve a particularly efficient utilization of the optically emitted power by virtue of the fact that an improved method is available for providing optimized pulse widths. As a result, both the range of the data transmission, the lifetime of the battery, and also the transmission quality are improved.

It is currently infrared light-emitting diodes (IR-LED), which can be produced by means of LPE and MOVPE methods, that are predominantly used for data transmission in accordance with the above-named standard. In order to improve efficiency, these optical diodes typically have a lens, integrated in the housing, for focusing the emitted radiation.

In modern circuit arrangements for optical data transmission, a first semiconductor module with a driver stage such as, for example, a bipolar transistor is generally connected to a second semiconductor module with a transmitting diode. However, to date the driver stage and the transmitting diode have been arranged in separate housings, which are interconnected externally on the printed circuit board. The overall space requirement of the circuit arrangement on the printed circuit board thereby becomes relatively large and, in addition to the extra outlay on mounting, this is also associated with high costs owing to the two components which are separated from one another in a discrete fashion.

There is a need firstly for even more improvement to this circuit arrangement with regard to the transmitted power and to the battery consumption. Secondly, the aim is also to reduce the space requirement of known circuit arrangements for optical data transmission as far as possible.

Improvements can be achieved only with difficulty by reducing the width of the light pulses with known circuit arrangements for data transmission comprising a power driver module and a transmitting diode module. Firstly, the switching times of driver modules typically used are very long, while secondly the known IR-LED diodes with upstream semiconductor switches are not capable of generating sufficiently short light pulses with a pulse width of less than approximately 5000 ns.

SUMMARY OF THE INVENTION

It is therefore the object of the present invention to provide an optical transmitting module which is improved by comparison with known transmitting modules for data transmission and which has an optimized efficiency. The aim is also that the transmitting module can be designed to be as small as possible and can therefore be effectively integrated in existing systems.

This object is achieved according to the invention by an optical transmitting module constructed as follows:

In accordance therewith, an optical transmitting module is provided which is defined by at least one first semiconductor chip which in each case has at least one vertical light-emitting semiconductor component which is designed for transmitting data and/or signals, and by at least one second semiconductor chip which has a semiconductor switching device which is provided for the purpose of switching the vertical light-emitting semiconductor component, the first semiconductor chip(s) and the second semiconductor chip(s) being embedded jointly in a single housing.

Suitable optical semiconductor transmitting elements are preferably diodes emitting in the vertical direction, in particular vertical light-emitting laser diodes. Such laser diodes are also known as VCSEL (Vertical-Cavity Surface-Emitting Laser) diodes. The design of a VCSEL diode is described, for example, in German Published, Non-Prosecuted Patent Application DE 198 39 305 A1, corresponding to U.S. patent application Ser. No. 20010035492. VCSEL diodes have a particularly high efficiency and a short switching time of preferably less than 10 ns. By contrast with most optical diodes such as LPE diodes or MOVPE diodes, which are very temperature-sensitive, VCSEL diodes are extremely robust thermally.

Particularly when it is operated at a very high switching frequency, the semiconductor switching device heats up significantly, that is to say by a few ten to a hundred degrees Celsius. For example, in the case of power MOSFETs, the operating temperature is approximately 125° C. Whereas such heating up in the surroundings of optical diodes normally used would lead to the failure of these components, such a temperature rise has virtually no effect on the functioning and the operation of a VCSEL diode. The semiconductor components according to the invention can therefore be integrated very effectively in a single housing, thus achieving an important step in the further miniaturization of such transmitting modules. Such optical transmitting modules can thereby also, of course, be produced very much more cost-effectively than previous optical transmitting modules. The previously required logistics and mounting costs are thereby halved at least, in approximate terms.

A further advantage of VCSEL diodes consists in a vanishingly small degradation, the result being that the transmitting module according to the invention can advantageously be operated over the entire service life virtually without impairment of its functionality or its power.

However, the invention is not limited to optical transmitting elements designed as VCSEL diodes. Rather, it would also be possible to make use of any other (vertically emitting) transmitting diode, for example what is termed the RCLED (Resonant-Cavity Light-Emitting Diode), although this is also not so advantageous as a transmitting diode designed as a VCSEL diode.

The optical transmitting module can include one or more semiconductor chips which in each case have one or more optical, vertically emitting transmitting diodes integrated in the respective semiconductor substrate. The two semiconductor chips are advantageously arranged jointly on a common lead frame.

It is expedient for the housing to be a cast housing or a molding housing, in particular a cast housing or a molding housing made from a material which is at least partially transparent to visible light and/or infrared light. It is possible for the CoolSET technology or Duopack technology used in Infineon Technologies AG to be used with very particular preference as housing technology. The housing of the optical transmitting module can preferably also be designed in a known SMD design.

Through the use of a vertically emitting laser diode integrated in the housing it is advantageously possible to dispense with optical means for beam focussing such as a lens, for example, which is arranged inside the housing. This results in a particularly space-saving optical component.

It is particularly advantageous in this context when a diffuser material is admixed to the material of the housing. The half-angle or the divergence of the radiation can be set in a specific and defined fashion via the concentration of the diffuser which can, for example, include carbon powder which is admixed to the material of the housing. A more or less ideal emission characteristic can be set in this way. The emission characteristic is a function of many parameters—for example the desired requirement, the transmitting module, the transmitted power, etc. The required transmitted power can advantageously also be optimized upon optimization of the emission characteristic.

In an advantageous development, in addition to the vertical light-emitting semiconductor component it is also possible for at least one further optical semiconductor component, for example a simple LED also to be integrated in the housing.

The semiconductor switching device is preferably a power semiconductor switch. In a particularly advantageous and simple refinement, the semiconductor switching device is designed as a MOSFET. All types of MOSFET, that is to say p-channel and n-channel MOSFETs, as well as enhancement-mode MOSFETs and depletion-mode MOSFETs would be conceivable here. Particularly preferred are the CoolMOS semiconductor components marketed by Infineon Technologies AG. MOSFETs are suitable, in particular, because of their high switching speed of less than approximately 50 ns, such that it is possible to generate light pulses with a width of less than 500 ns. MOSFETs also have a low switching energy and a very low power loss, thus rendering it possible to operate in a way which saves the battery, particularly in the case of systems with a local energy supply.

Moreover, it would also be possible to make use for the purpose of switching or driving the optical transmitting element of conventional bipolar transistors, IGBTs, thyristors, triacs or similar semiconductor components designed for switching, even though these are not so advantageous as MOSFETs.

The semiconductor switching device can be designed both as what is termed a high-side switch and as a low-side switch. However, it would also be possible to use as semiconductor switching device any other more or less complex driver circuit such as, for example, a full-bridge or half-bridge circuit. Also conceivable would be a logic circuit or a program-controlled unit—for example a microprocessor—which has an output driver circuit, and which drives the optical transmitting element appropriately in accordance with the programmed logic or the program contained in it.

For the case in which the semiconductor switching device is a MOSFET, the latter can expediently be fitted with an integrated freewheeling diode which is arranged in parallel with the load path of the MOSFET.

Suitable semiconductor switching devices for generating current and/or voltage pulses for driving the transmitting modules are preferably designed so as to generate square-wave pulses with a pulse width of less than approximately 800 ns, in particular less than approximately 400 ns.

The vertical light-emitting semiconductor component and the semiconductor switching device are electrically interconnected inside the housing, typically by means of bonding wires. Their terminals for a supply potential, as well as the control terminal of the semiconductor switching device are electrically connected externally to contact pins leading to the outside.

Further advantageous refinements and developments of the invention may be gathered from the subclaims, the following description and the figures.

The invention is explained in more detail below with the aid of the exemplary embodiments specified in the figures of the drawing, in which:

BRIEF DESCRIPTION OF THE DRAWINGS

In all the figures of the drawing, identical or functionally identical elements are provided with identical reference symbols—unless otherwise stated.

DESCRIPTION OF THE PREFERRED EMBODIMENTS

Figure 1:
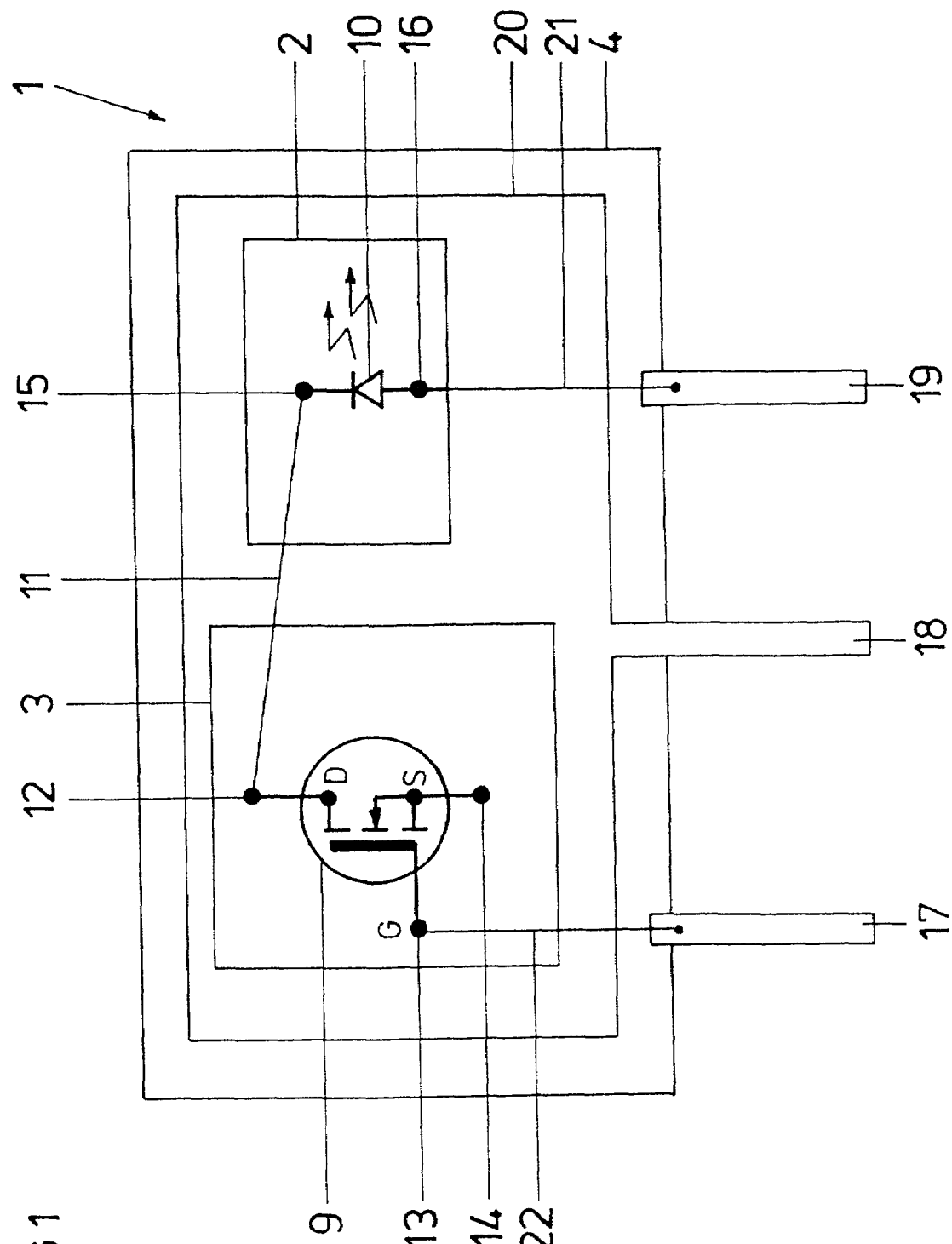
FIG. 1 shows a schematic of the design of the optical transmitting module according to the invention.

FIG. 1 shows a schematic of the design of the optical transmitting module according to the invention. The optical transmitting module 1 is denoted by 1 in FIG. 1. The optical transmitting module 1 includes two semiconductor chips 2, 3.

The first semiconductor chip 2 comprises a vertical light-emitting laser diode 10 which is designed in the present case as what is termed a VCSEL diode 10. The first semiconductor chip 2 comprises a semiconductor substrate containing gallium arsenide (GaAs). The second semiconductor chip 3 comprises a semiconductor switching device 9, designed as an n-channel depletion-mode MOSFET, for switching the vertical light-emitting laser diode 10. The second semiconductor chip 3 usually comprises a silicon substrate.

The two semiconductor chips 2, 3 are arranged according to the invention on a common lead frame 20 and enclosed jointly in a common housing 4. The housing 4 typically consists of an epoxy resin material or a standard dark plastic, the material of the housing 4 being at least partially transparent to IR light. Admixed to the epoxy resin is a diffuser component via which it is possible to set a half-angle, depending on the quantity of the admixed diffuser. The half-angle is to be understood as that angle at which the light is deflected laterally, measured from its beam source. It is typical to set a half-angle of ±30°, in order to satisfy the industrial Standard ICE 825 for maintaining eye safety. The housing 4 has contact pins 17 . . . 19 which lead externally to the outside and are electrically coupled to the semiconductor chips 2, 3.

The laser diode 10 has a cathode terminal 15 and an anode terminal 16. The semiconductor switching device 9 has three terminals 12 . . . 14—two load terminals 12, 14 and a control terminal 13. A first supply potential, for example a reference potential, can be applied to a first load terminal 14 via the contact pin 18. The second load terminal 12 is connected inside the housing 4 to the cathode terminal 15 of the laser diode 10 by means of a bonding wire 11.

The control terminal 13 of the semiconductor switching device 9 is connected in an electrically conductive fashion to the contact pin 17 via a further bonding wire 22. In the present case, the terminal 14 is designed as source terminal 14 which is arranged in the case of the semiconductor chip 3 on the rear side thereof such that the rear contact is fastened on the lead frame 20 in an electrically conductive fashion. The second metallic contact pin 18 is then connected mechanically to the lead frame 20 and thus also electrically to the source terminal 14. It follows that there is no need here for a bonded connection. The anode terminal 16 of the laser diode 10 is coupled electrically via a bonding wire 21 to the third contact pin 19, to which a second supply potential is applied.

Figure 2A:
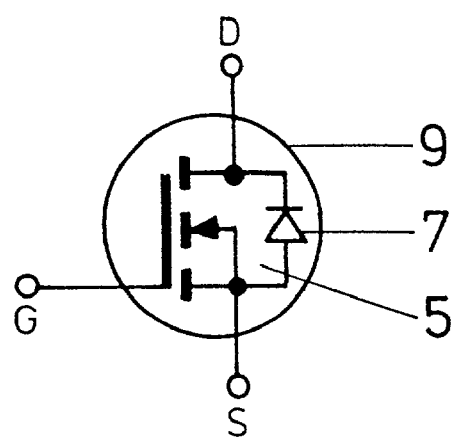
FIG. 2 shows two exemplary embodiments for implementing a semiconductor switching device for driving the optical transmitting diode.
Figure 2B:
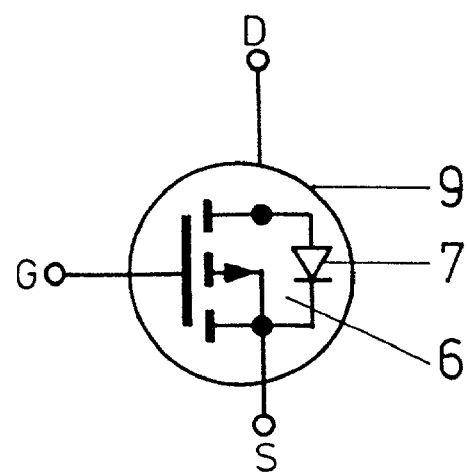

FIG. 2 shows two advantageous exemplary embodiments for implementing a semiconductor switching device 9 for driving the optical laser diode 10. The semiconductor switching device 9 in FIG. 2(a) shows an n-channel MOSFET 5 with freewheeling diode 7. FIG. 2(b) shows an alternative semiconductor switching device 9, which has a p-channel MOSFET 6 with freewheeling diode 7. The freewheeling diodes 7 are arranged in each case in parallel with the load path of the MOSFETs 5, 6.

Figure 3A:
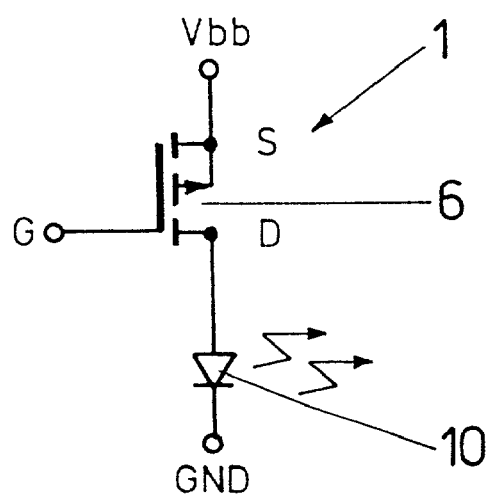
FIG. 3 shows two equivalent circuit diagrams of a transmitting module according to the invention for transmitting signals.
Figure 3B:
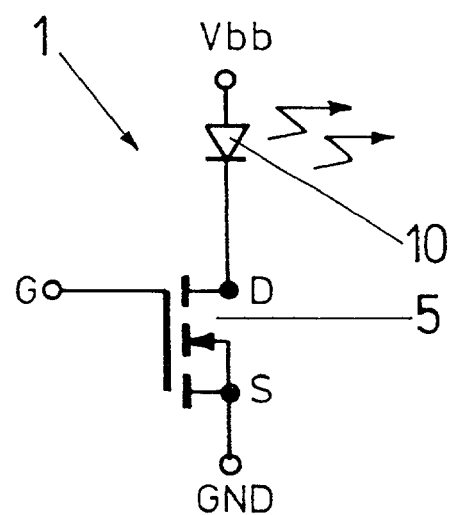

FIG. 3 shows two possible equivalent circuit diagrams of the transmitting module 1 according to the invention for transmitting signals. A p-channel MOSFET 6 is constructed as high-side switch in FIG. 3(a). The MOSFET 6 is designed here for driving, that is to say for switching the laser diode 10 arranged between the reference potential GND and the drain terminal D of the MOSFET 6. The circuit arrangement in FIG. 3(b) shows an alternative design with a low-side switch which is constructed as an n-channel MOSFET 5 and in the case of which the laser diode 10 is arranged between the drain terminal D of the MOSFET 5 and the supply potential Vbb.

It may be laid down in summary that in the case of the optical transmitting module according to the invention which is designed as described there is a need for a structural outlay which is smaller in terms of installation by comparison with the prior art, but it is still possible nevertheless to achieve at least the same functionality in conjunction with substantially lower production costs, without simultaneously having to accept the disadvantages of optical transmitting modules according to the prior art.

The optical transmitting module according to the invention has been explained with the aid of the above description so as to clarify the principle of the invention and its practical application as well as possible. Of course, the invention can be modified in a suitable way in a multifarious way within the scope of action of the person skilled in the art.

The invention claimed is:

1. An optical transmitting module, comprising:
    at least one first semiconductor chip having at least one vertical light-emitting semiconductor component for transmitting at least one of data and signals;
    at least one second semiconductor chip having a semiconductor switching device for switching said vertical light-emitting semiconductor component, said semiconductor switching device generating approximately square-wave pulses with a pulse width of less than 800 ns; and
    a single housing in which said at least one first semiconductor chip and said at least one second semiconductor chip are jointly embedded.

2. The transmitting module according to claim 1, wherein said vertical light-emitting semiconductor component is a vertical light-emitting laser diode.

3. The transmitting module according to claim 1, including a single lead frame on which said at least one first semiconductor chip and said at least one second semiconductor chip are jointly fastened.

4. The transmitting module according to claim 1, wherein said housing contains no optical device for beam focusing.

5. The transmitting module according to claim 1, wherein said housing contains a material to which a diffuser material is admixed.

6. The transmitting module according to claim 1, wherein said housing is a cast housing.

7. The transmitting module according to claim 1, wherein said housing is a molded housing.

8. The transmitting module according to claim 1, wherein said housing includes a material at least partially transparent to at least one of visible and IR light.

9. The transmitting module according to claim 1, including an LED semiconductor component integrated in said housing in addition to said vertical light-emitting semiconductor component.

10. The transmitting module according to claim 1, wherein said semiconductor switching device is a MOSFET.

11. The transmitting module according to claim 1, wherein said semiconductor switching device is a MOSFET with an integrated freewheeling diode.

12. The transmitting module according to claim 1, wherein said semiconductor switching device generates approximately square-wave pulses with a pulse width of less than 400 ns.

13. The transmitting module according to claim 1, wherein:
    said vertical light-emitting semiconductor component and said semiconductor switching device have load terminals and terminals for a supply potential, and said semiconductor switching device has a control terminal;
    bonding wires electrically interconnect said load terminals inside said housing; and
    contact pins lead externally outside said housing and are electrically connected to said terminals for a supply potential and to said control terminal.

* * * * *